(12) United States Patent
Coffa et al.

(10) Patent No.: US 7,829,904 B2
(45) Date of Patent: Nov. 9, 2010

(54) OPTICAL RADIATION EMITTING DEVICE AND METHOD OF MANUFACTURING SAME

(75) Inventors: Salvatore Coffa, Catania (IT); Maria Castagna, Enna (IT); Anna Muscara', Messina (IT); Mariantonietta Monaco, Campobasso (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 544 days.

(21) Appl. No.: 11/422,264

(22) Filed: Jun. 5, 2006

(65) Prior Publication Data

US 2006/0284200 A1  Dec. 21, 2006

(30) Foreign Application Priority Data

Jun. 16, 2005  (EP)  ................... 05425430

(51) Int. Cl.
  *H01L 33/00*  (2010.01)
(52) U.S. Cl. .................. 257/98; 257/79; 257/E33.069; 438/27
(58) Field of Classification Search .................. 257/79, 257/98; 438/27
  See application file for complete search history.

(56) References Cited

U.S. PATENT DOCUMENTS

| 5,493,577 | A |   | 2/1996  | Choquette et al. |           |
|-----------|---|---|---------|------------------|-----------|
| 5,724,374 | A | * | 3/1998  | Jewell           | 372/45.01 |
| 5,726,462 | A |   | 3/1998  | Spahn et al.     |           |
| 5,818,863 | A |   | 10/1998 | Nabet et al.     |           |
| 5,848,086 | A | * | 12/1998 | Lebby et al.     | 372/46.013 |
| 5,877,509 | A |   | 3/1999  | Pau et al.       |           |
| 6,075,804 | A | * | 6/2000  | Deppe et al.     | 372/96    |
| 6,636,542 | B1 | * | 10/2003 | Ueki            | 372/46.01 |
| 6,639,932 | B1 | * | 10/2003 | Knopp et al.    | 372/96    |
| 2002/0150130 | A1 | * | 10/2002 | Coldren et al. | 372/20    |
| 2005/0063440 | A1 | * | 3/2005  | Deppe           | 372/50    |
| 2006/0062266 | A1 | * | 3/2006  | Jewell          | 372/43.01 |
| 2010/0102346 | A1 | * | 4/2010  | Castagna et al. | 257/98    |
| 2010/0151603 | A1 | * | 6/2010  | Castagna et al. | 438/29    |

FOREIGN PATENT DOCUMENTS

JP  2005-311175  * 11/2005

OTHER PUBLICATIONS

European Search Report No. EP 05 42 5430.
Castagna, et al. "SI-based Resonant Cavity Light Emitting Devices"; Proceedings Of The Spie-The International Society For Optical Engineering Spie-Int. Soc. Opt. Eng. USA; 2004; pp. 26-35; vol. 5366, No. 1; Bellingham, WA USA.

* cited by examiner

*Primary Examiner*—A. Sefer
(74) *Attorney, Agent, or Firm*—Hogan Lovells US LLP

(57) ABSTRACT

A device for emitting optical radiation is integrated on a substrate of semiconductor material. The device includes an active layer having a main area for generating radiation, and first and second electro-conductive layers having an electric signal that generates an electric field to which an exciting current is associated. In the device, a dielectric region is formed between the first and second layers to space peripheral portions of the first and second layers so that the electric field in the main area is higher than the electric field between the peripheral portions, thereby facilitating generation of the exciting current in the main area. A method of manufacturing is also disclosed.

30 Claims, 6 Drawing Sheets

OPTICAL RADIATION EMITTING DEVICE AND METHOD OF MANUFACTURING SAME

RELATED APPLICATION

The present application claims priority of European Patent Application No. EP 05425430.5 filed Jun. 16, 2005, which is incorporated herein in its entirety by this reference.

FIELD OF THE INVENTION

The present invention relates to optical radiation emitting devices and, more particularly, a resonant cavity optical radiation emitting device.

BACKGROUND OF THE INVENTION

In the last years, remarkable research activity has been aimed at developing light emitting devices employed in the optical transmission field within a communication network as light sources.

One type of these devices is the Resonant Cavity Light Emitting Diode (RCLED). U.S. Patent Application Publ. No. 2003/0209714 describes a RCLED including an active layer made up of one or more quantum well (QW) layers containing gallium (Ga), indium (In) and nitrogen (N). The quantum well layer is inserted into a resonant cavity made up of a first mirror of reflecting metallic material which also has the function of electric contact and a second mirror formed by a plurality of pairs of semiconductor layers having different refraction indexes. The materials used for the second mirror are aluminum gallium nitride (AlGaN) and gallium nitride, both with a high N-type doping. This RCLED device is an electric pumping device, and, hence, it provides the application of an electric current passing through the two conductive mirrors causing the optical radiation emission as a consequence of a recombination of charges opposite in sign being formed in the active portion or element.

Vertical Cavity Surface Emitting Laser (VCSEL) devices can be used as an alternative to the RCLED devices. VCSEL devices exploit two conductive mirrors forming a resonant cavity into which an active portion or element (e.g., a laser) that may have a population inversion therein is inserted. Even in this case, the electric pumping is carried out by the electrons passing through the mirrors until they reach the active element. In the case of a VCSEL device, the optical radiation generation is monochromatic and consistent, as a consequence of the optical population inversion in the active element, as it is well-known to those skilled in the art.

A particular VCSEL device is described in the article "Tunable VCSEL", by C. J. Chang-Hasnain, IEEE J. Select Topics, Quantum Electronics, Vol. 6, No. 6, 2000. With reference to the resonant cavities, both for the RCLED devices and the VCSEL ones, the mirrors are manufactured so as to not have the same reflectivity. Particularly, one of the two mirrors is capable of transmitting a part of the radiation to the outside. For example, a mirror may have an ideal total reflectivity (99-100%) whereas the second one may have a 90% reflectivity, such that the light emission is not symmetric, but, preferably, one-sided.

It shall also be noted that in the prior art resonant cavity devices (RCLED or VCSEL) materials of the III-V groups and the II-VI groups are used for providing the cavities.

SUMMARY OF THE INVENTION

The object of the present invention is to provide a device for emitting optical radiation of the electric pumping type of an active element or portion with a structure providing an alternative to the known types. Preferably, the inventive device can, for example, be manufactured with materials different from the ones currently used.

This is achieved by the device as described in the following description with reference to the attached figures. More particularly, a device is provided for emitting optical radiation that is integrated on a substrate of semiconductor metal. The device includes a first mirror and a second mirror of the dielectric type which define a resonant cavity. An active layer is provided in the cavity with a main area intended to be excited in order to generate the optical radiation. First and second electro-conductive layers are associated with the first and second mirrors, respectively, to generating an electric field to which an exciting current for the active layer is associated.

Typically, the main area of the active layer is directly facing the first and second electro-conductive layers. The device may further include a dielectric region between the first and second electro-conductive layers to space corresponding peripheral portions of the first and second electro-conductive layers from each other. In this manner, the electric field being presented in the main area of the active layer is higher than one being present between the peripheral portions, which facilitates a corresponding generation of the exciting current in the main area of the active layer.

BRIEF DESCRIPTION OF THE DRAWINGS

The invention will be better understood from the following detailed description in one embodiment thereof which is given by way of example, but by no means limiting example, with reference to the enclosed drawings, in which.

DETAILED DESCRIPTION

With reference to FIGS. 1 to 10, a method is described for manufacturing a RCLED device with an emission wavelength $\lambda_0$ and in which the active means (e.g., element or layer) to be used is in some embodiments of the SRO type, i.e., silicon dioxide ($SiO_2$) enriched with silicon Si (Silicon Rich Oxide, SRO). According to a described example, the manufacturing method provides a technology based on the use of silicon and silicon dioxide (Si-based technology).

Figure 1:
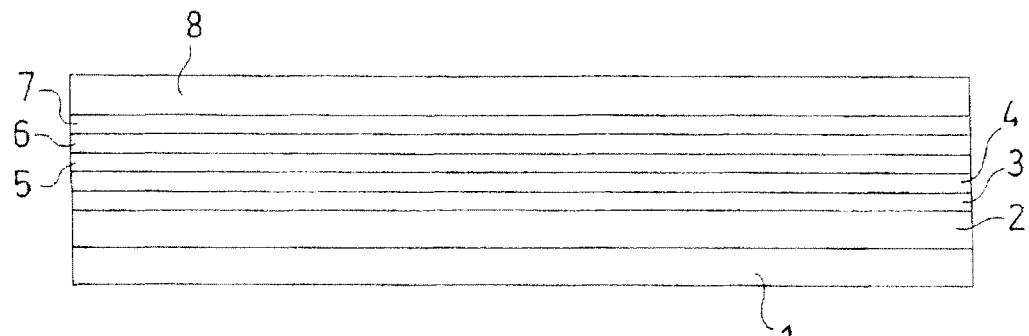
FIGS. 1 to 9 are longitudinal sectional views of several intermediate steps of a method for manufacturing the device according to the invention.

As shown in FIG. 1, a first layer of silicon dioxide 2 with a thickness $d_2$ and a refraction index $n_2$ is thermally raised preferably on a silicon support substrate 1. Alternatively, this first layer 2 can be obtained not by rising but by any deposition technique known by those skilled in the field of silicon integration. A first not-doped silicon layer 3 having a refraction index $n_3$ and a thickness $d_3$ is deposited on the first dioxide layer 2. A second silicon dioxide layer 4 of a thickness $d_4$ and a refraction index $n_4$ is thus deposited on the first not-doped silicon layer 3. A second silicon layer 5 having a refraction index $n_5$ and a thickness $d_5$ is deposited on the second silicon dioxide layer 4. A third silicon dioxide layer 6 having a refraction index $n_6$ and a thickness $d_6$ is deposited on the second silicon layer 5. This sequence can be repeated several times thus increasing the reflectivity of the lower mirror made of a variable number of pairs of silicon/silicon dioxide with a suitable thickness and a refraction index.

A first electro-conductive layer 7, provided according to one example with doped polysilicon (preferably, with a doping of the type N+), is deposited on this third silicon dioxide layer 6. The doping may be obtained by doping an amorphous Si layer either in the deposition step or in a subsequent installation step. This material has a refraction index $n_7$ and is deposited until it reaches a thickness $d_7$.

A dielectric material layer 8 is then deposited on the doped polysilicon layer 7. For example, the layer 8 may be a passivation silicon oxide and have the function of an electric insulator between portions of the device. This passivation layer 8 (having, for example, a thickness of 10,000 Å) is known to skilled operators, in other applications, as VAPOX when it is obtained by chemical vapor deposition. A VAPOX layer being chemically vapor deposited has a large amount of hydrogen therein which is, advantageously, ejected by densification, e.g., a heat treatment at about 1100° C. for a period of about 60 minutes.

Figure 2:
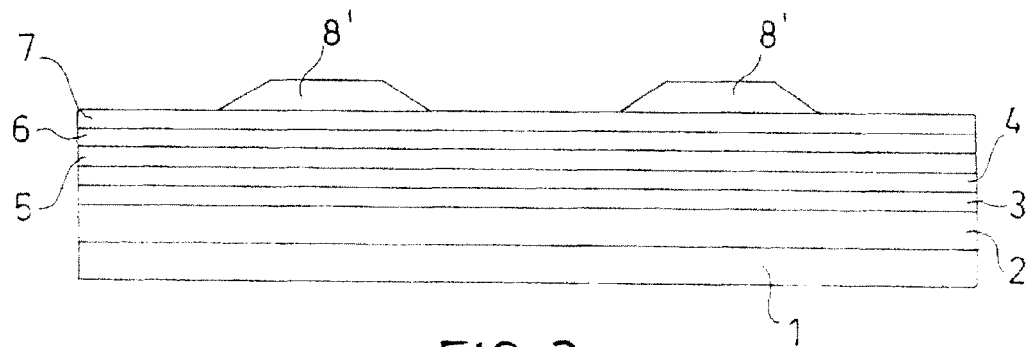

A typical photolithographic process is then carried out (comprising a first defining step for a photomask and a second photo-wet etching step) in order to obtain a dielectric region 8' from the dielectric layer VAPOX 8, as illustrated in the example from FIG. 2, of a toroidal base (this characteristic is not visible from the figure) and a substantially trapezoidal section. The substantially trapezoidal section is due to the use of a wet etching, and hence isotropic, allowing tilted walls to be engraved.

The main function of the dielectric region 8' will be discussed below while describing the operation mode of the device 100, the manufacturing method of which is being described. A secondary function of the dielectric region 8' is the insulation of the device (e.g., device 100 in FIG. 10) from other optoelectronic devices which can be integrated on the same substrate 1.

Figure 3:
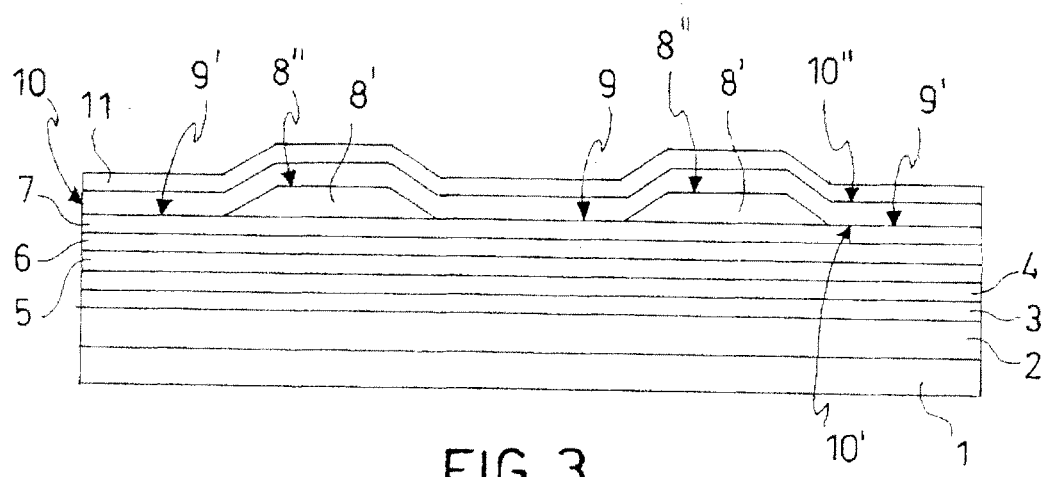

As shown in FIG. 3, a deposition step of an active means layer (or simply, active layer) 10 having a first surface 10' and a second surface 10", being opposite to the first one 10', which morphologically follows the contour of the structure illustrated in FIG. 2, is then carried out. In greater detail, the first surface 10' is in contact with first electro-conductive layer 7, in a side region 9' and in a first region 9, being substantially defined within dielectric region 8', and in contact with dielectric region 8' in a second region 8". The active means layer 10 has a refraction index $n_{10}$ and is deposited until it reaches a thickness $d_{10}$.

The active means layer 10, besides the already mentioned SRO, may be silicon dioxide doped with rare earths such as, for example, terbium (Tb), ytterbium (Yb) or erbium (Eb). The possibility of using these rare earths as active means, layers, or elements is described in the article "High efficiency light emitting devices in silicon", by M. E. Castagna, et al, *Material Science and Engineering*, B105 (2003) pages 83-90.

Afterwards, a second electro-conductive layer 11 manufactured, for example, from doped polysilicon N+, is then deposited above the second surface 10" of the active means layer 10. This material has a refraction index $n_{11}$ and is deposited until it reaches a thickness $d_{11}$. The two polysilicon layers 7, 11 may also have a different doping to which respective refraction indexes and respective thicknesses correspond. The doping of one of the two polysilicon layers 7, 11 can be of the type P+. It is preferable that at least one of the two polysilicon layers 7 and 11 should be obtained by a doping of the type N+.

Figure 4:
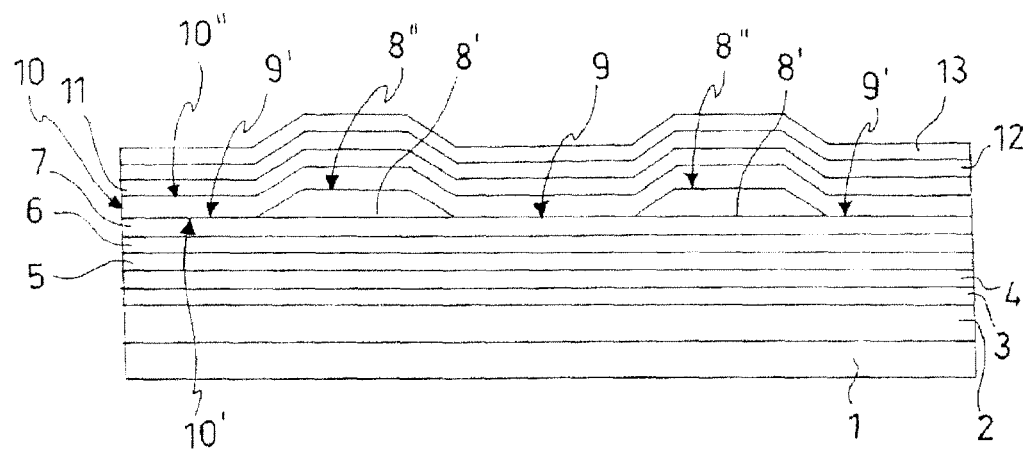

With reference to FIG. 4, a fourth silicon dioxide layer 12, having a refraction index $n_{12}$ and a thickness $d_{12}$ is deposited on the second doped polysilicon layer 11. A third non-doped silicon layer 13 having a refraction index $n_{13}$ and a thickness $d_{13}$ is deposited on this fourth silicon dioxide layer 12. Even in this case, the deposition sequence can be repeated, thus obtaining a mirror with a suitable reflectivity, with regard to the applications of interest, and in any case, with a reflectivity which is lower than the one of the lower mirror, the manufacturing of which has been described above. However, it is preferable that the deposition sequence should end with the deposition of a silicon layer with a suitable thickness and refraction index. The deposition of a passivation oxide layer is provided on the latter, as it will be described herein below.

Figure 5:
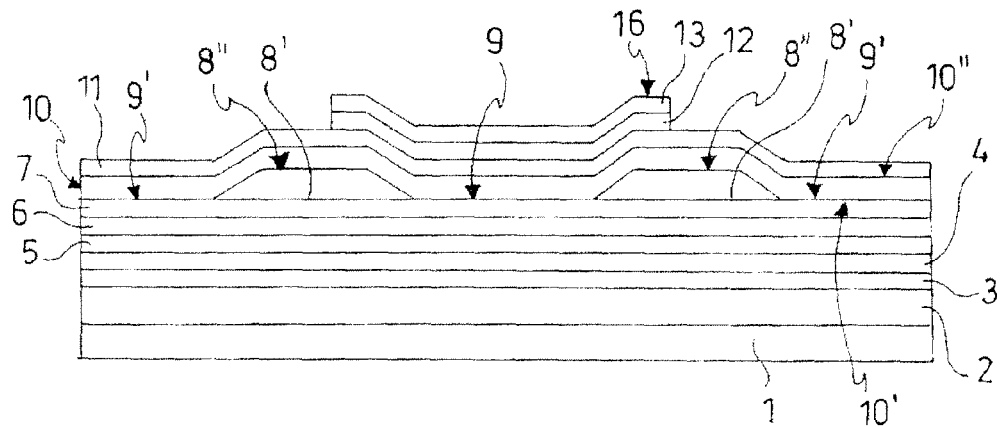

A typical photolithographic process including a first defining step for a photomask and a second photo-dry etching step for removing side portions of the layers 12 and 13 thus leaving a first multi-layer structure 16 unchanged being formed by the pile of said layers substantially aligned with the first region 9 and part of the dielectric region 8' is followed (FIG. 5). The use of a dry etching of the anisotropic type allows the multi-layer structure to be defined by substantially vertical sidewalls.

Figure 6:
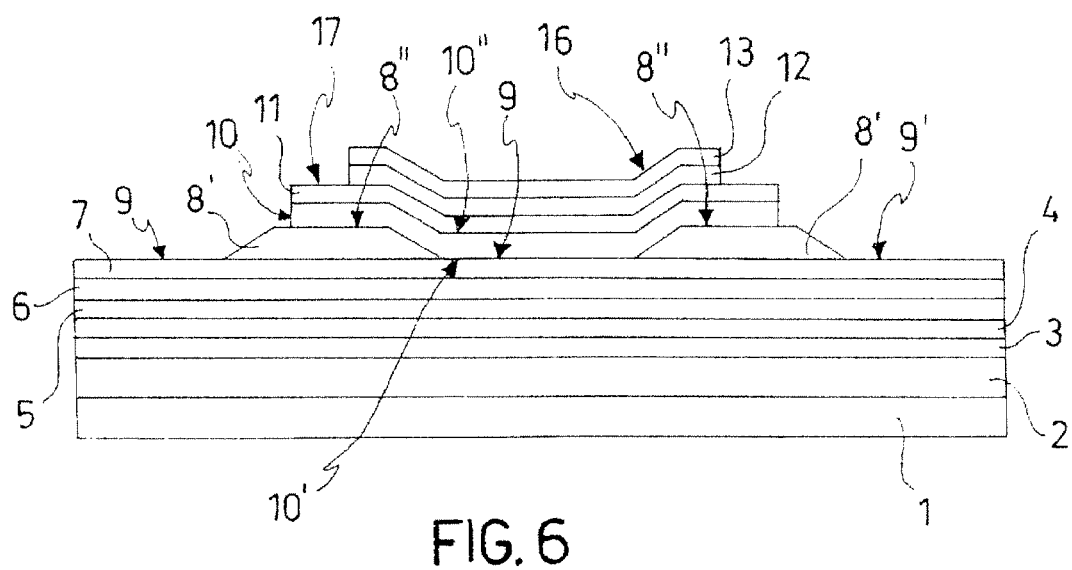

Similarly, a photolithographic process is then carried out in which a photomask is defined and a photo-dry etching is carried out so as to remove further side portions of the layers 10 and 11 in order to obtain a second multi-layer structure 17 formed by the pile of said layers aligned with almost all the whole part of the dielectric region 8'" and more extended relative to the first multi-layer structure 16, such as illustrated in FIG. 6. A subsequent photolithographic process includes the definition of a photomask the contour of which exposes the first polysilicon layer 7 to a dry etching step, following which peripheral portions of the first layer 7 are removed, thus obtaining the shape shown in FIG. 7 leaving a peripheral portion of the layer 6 uncovered.

Figure 7:
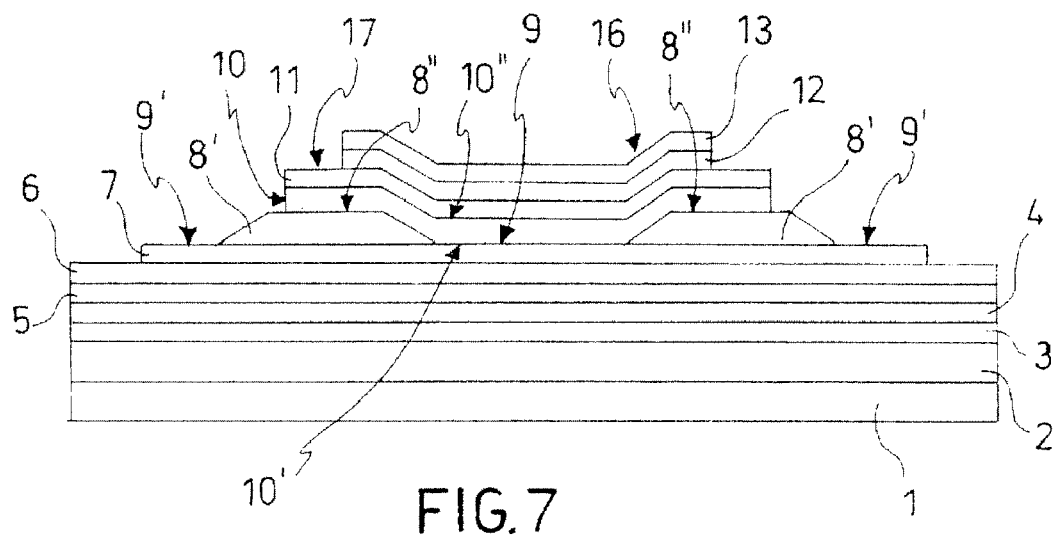
Figure 8:
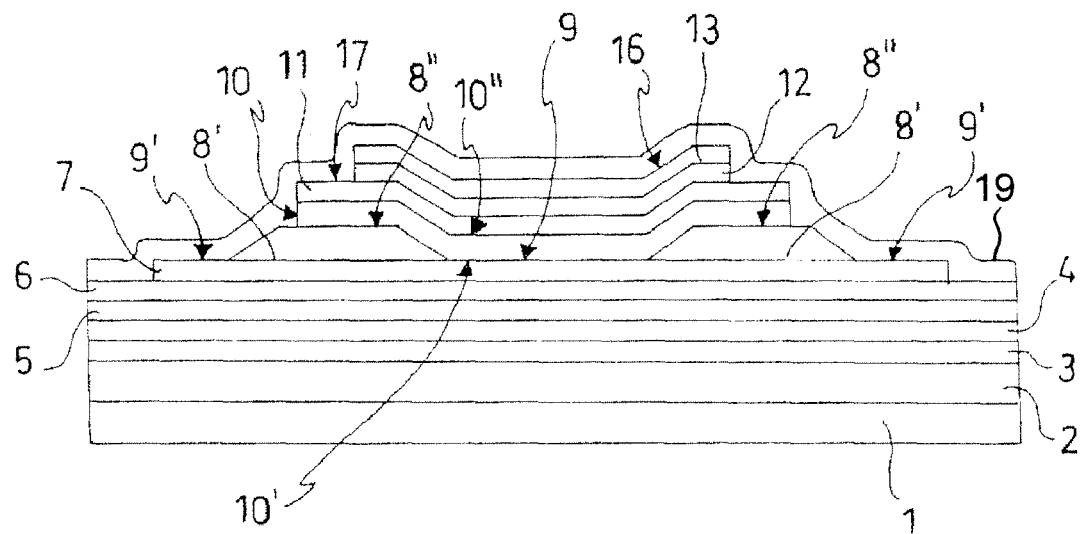

With reference to FIG. 8, a fifth oxide layer 19 forming a passivation layer having a refraction index $n_{19}$ and a thickness $d_{19}$ is deposited on the structure from FIG. 7. This layer has the function of a passivation layer and is a part of the upper mirror. An annealing step at a temperature ranging between 750° C. and 1100° C. or, alternatively, a rapid thermal annealing (RTA) step is then followed in order to activate the polysilicon doping at a temperature of about 1000° C. for a period of about 60 seconds. The selection of the heat treatment to be used between the two of them depends on the desired active means to be activated. For example, in the case of SRO, an annealing at 1100° C. may be carried out.

Figure 9:
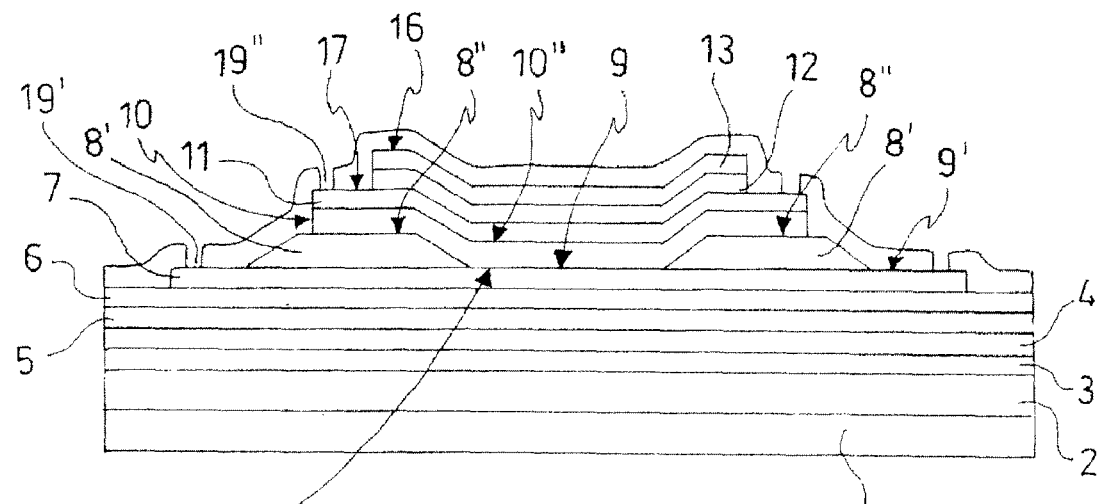

A first groove 19' and a second groove 19" are engraved in the oxide layer 19, for example simultaneously, by a single photolithographic process, due to the thickness uniformity of the layer 19. The first groove 19' extends in depth up to the first polysilicon layer 7 and is, for example, outside the dielectric region 8', thus surrounding the latter. The second groove 19" extends in depth up to the second non-doped polysilicon layer 11, thus surrounding the first multi-layer structure 16, such as shown in FIG. 9.

Figure 10:
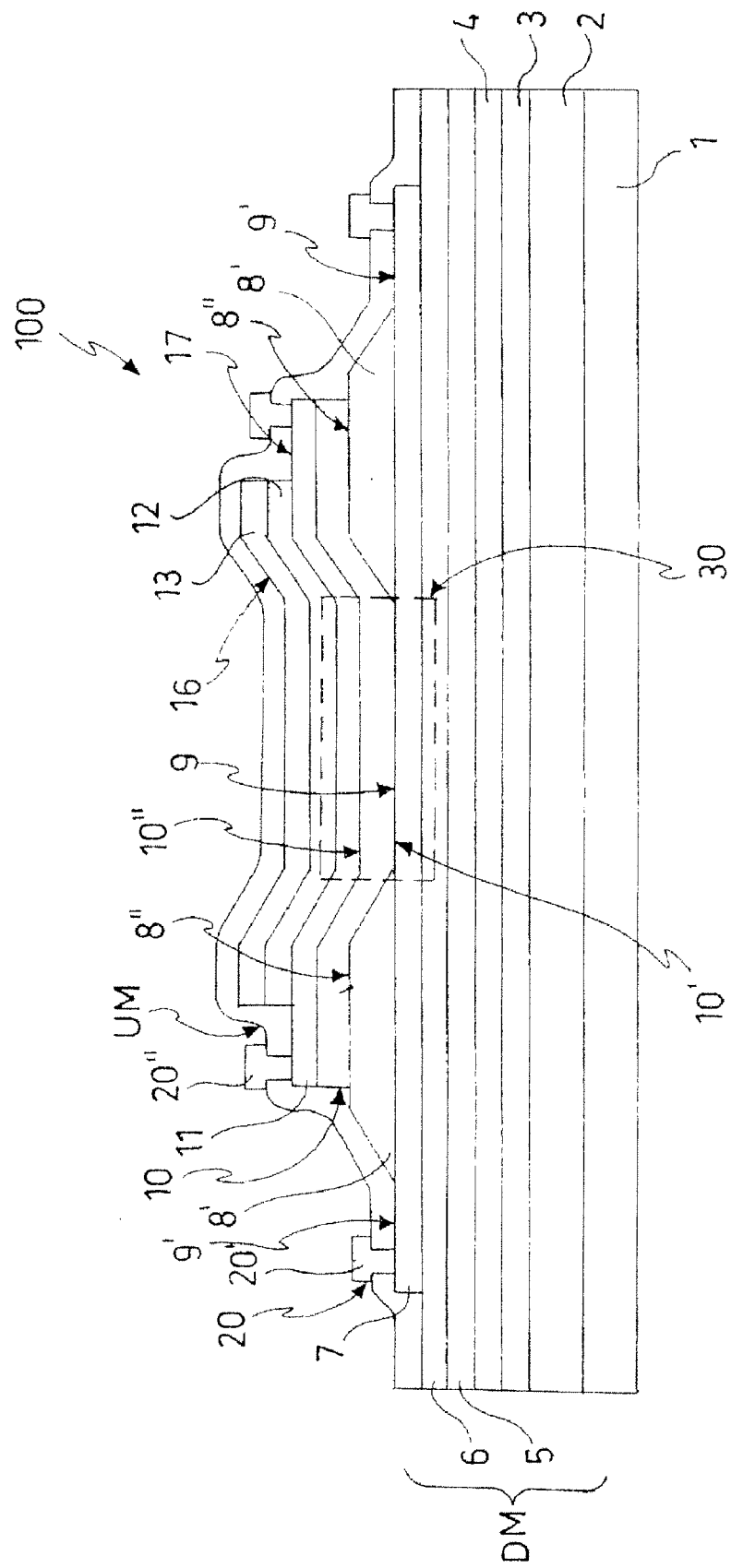
FIG. 10 is a longitudinal sectional view of the device according to the invention.

With reference to FIG. 10, a deposition step of electro-conductive material, such as, for example, a metallization 20 is provided. A conventional photolithographic process for defining a photomask and an isotropic dry etching step for engraving on the metellization 20 a first 20' and a second 20" metallic regions suitable to be in contact with the first electro-conductive layer 7, by means of the first groove 19', and the second electro-conductive layer 11, by means of the second groove 19", respectively, is then followed. FIG. 10 shows the structure of the RCLED device 100 obtained by the "Si-based technology" method described above.

The functions of the different layers presented above will be better specified herein below. The substrate 1 is the support of the device 100, whereas the first silicon dioxide layer 2 may preferably have such characteristics as to insulate the same device from the substrate 1.

The layers 2 to 7 provide a multi-layer lower mirror DM including a plurality of pairs of silicon-silicon dioxide layers, Si—$SiO_2$, such as, for example, the layer pairs 2-3, 4-5, 6-7. The layers 11, 12, 13 and 19 provide a multi-layer upper mirror UM including a plurality of pairs of silicon-silicon dioxide layers, such as, for example, the layer pair 11-12 and, in the provided cases, the pair 13-19 or 11-19, for low-reflectivity mirrors. It should be noted that the two lower DM and upper UM mirrors, each of which includes at least a dioxide layer, are dielectric mirrors. The active means layer 10 included between the lower mirror DM and the upper mirror UM defines a resonant cavity for the device 100 suitable to resonate at the emission wavelength $\lambda_0$.

To this purpose, each layer of the two mirrors substantially has such a refraction index and thickness that the following relations between the values of the optical thickness (i.e., the product between the refraction index and the thickness) of each layer are respected (Bragg's law):

$$n_2 d_2 = n_3 d_3 = n_4 d_4 = n_5 d_5 = n_6 d_6 = \lambda_0/4 \quad (1);$$

for the upper mirror UM, and $$n_{12} d_{12} = n_{13} d_{13} = \lambda_0/4 \quad (2);$$

for the lower mirror DM.

The thickness values and the refraction indexes of each layer have been defined above.

It shall be noted that the two upper UM and lower DM mirrors have different reflectivities. Particularly, the upper mirror UM, from which the optical radiation output is provided, has a reflectivity which is lower than the other mirror. For example, the lower mirror DM has a nominal reflectivity of 99-100% whereas the upper mirror UM has a reflectivity of 90% thus allowing the optical radiation reflecting through the latter to be about 10%.

The different reflectivity of the two mirrors can be obtained by manufacturing them with a different number of pairs of silicon-silicon dioxide. In the described example, preferably, the lower mirror DM has two pairs whereas the upper mirror UM comprises a single pair.

Generally, in order to increase the reflecting effect, the number of layers for each of the mirrors can be increased. The number of these pairs of silicon-silicon dioxide will be suitably fixed according to the device applications and based on the specifications thereof such as, for example, length, directivity, monochromatic aspect of the light beam. It shall be noted that although both the mirrors UM and DM can be provided to include more than one pair of silicon-silicon dioxide layers, it is also possible, as in the described example, that one or both the mirrors may include a single pair of silicon-silicon dioxide layers.

According to a particular embodiment, the passivation layer may have such characteristics as to be considered as provided in the upper mirror UM and yet maintain the function of a layer for insulating and starting the definition of the electric contacts. In a specific case, the passivation oxide layer 19 has such a refraction index $n_{19}$ and layer thickness $d_{19}$ as that the relation (2) defined above is valid.

According to a further particular embodiment, one of the mirrors, for example, the upper mirror UM, may further include a single pair of silicon-silicon dioxide layers in which the silicon dioxide layer is the same layer providing the passivation, such as the passivation oxide layer 19, and the polysilicon layer 11 provides the plate. Therefore, in this embodiment, the second polysilicon layer 11 has the double function of a conductive layer and a first layer for a dielectric mirror.

Moreover, it shall be noted that the Si-based technology is particularly advantageous because it allows mirrors with a high reflectivity to be obtained by using a limited number of pairs Si—$SiO_2$. This is due to the fact that the pair Si—$SiO_2$ has a high jump in the refraction index between the two layers and hence a high reflectivity. Advantageously, a variety of materials compatible with the silicon can be alternatively used. For example, the silicon nitride can be used in the place of the silicon dioxide, thus obtaining one or more pairs of silicon-silicon nitride.

By studying device design, the refraction index for each material is known and, after the value $\lambda_0$ has been fixed, each layer is deposited until reaching the suitable thickness for which the relations (1) and (2) defined above are valid. The observance of the relations (1) and (2) entails that for the radiation generated by the active means or layer having the emission wavelength $\lambda_0$ there is a constructive interference among the beams being reflected at each interface among adjacent layers having a different refraction index. For any wavelength different from $\lambda_0$, the beams suffer a destructive interference, and hence, they do not substantially allow the optical radiation emitted by the active means or layer of the device 100 to be detected outside the latter.

The first 7 and second 11 electro-conductive layers allow a pumping electric signal to be applied, which can be supplied thereto by the first 20' and second 20" metallic regions of the metallization 20 to the active means layer 10 due to their electrical conductivity characteristics.

Furthermore, the first 7 and second 11 electro-conductive layers are obtained by a doping that increases the electrical conductivity thereof. The layers 7, 11 are suitable to originate, if provided with an electric signal, a mutual current passage to which the generation of a respective electric field, the field lines of which substantially have a direction that is transverse to the plane of the two layers 7 and 11, corresponds. In all respects, the first layer 7 and the second layer 11 being electro-conductive can be defined as electrical plates being opposite to each other and separate from the active means layer 10 in which the propagation of a substantially uniform electric field occurs.

A non-sufficient doping of the two conductive layers 7 and 11 entails a non-uniform propagation of the electric field between the two plates. A recommended doping is, for example, higher than $10^{17}$ cm$^{-3}$. It is important, but not limiting, to note that the dielectric region 8' increases the distance between the first 7 and second 11 electro-conductive layers. In fact, the first 7 and second 11 electro-conductive layers are separated at the second region 8", and hence, they are spaced from the dielectric region 8' and the active means layer 10. On the contrary, in the first region 9, the first 7 and second 11 electro-conductive layers are only separated by the active means layer 10, thus being closer to each other compared to what may occur at the second region 8". Accordingly, under the same voltage applied to the first 7 and second 11 electro-conductive layers, the electric field, in the portion of the active means layer 10 corresponding to the first region 9, is higher than the one located at the second region 8". Therefore, the generation of an electric current (i.e. an electron passage) for exciting the same active means is facilitated in this portion of the active means layer directly facing the first 7 and second 11 electro-conductive layers. In other words, the dielectric region 8' allows the force lines of the electric field to be conveyed outside the dielectric region 8' and hence to the first region 9.

For this reason, the portion of the active means layer 10 corresponding to the first region 9 defines a main area generating the radiation, indicated in the figures with a dashed contour and a reference number 30. Moreover, the first 7 and second 11 electro-conductive layers have such particular optical characteristics as to ensure the required constructive interference to the upper and lower mirrors. Particularly, the first 7 and second 11 layers both substantially meet a relation which is similar to the relations (1) and (2):

$$n_7 d_7 = n_{11} d_{11} = \lambda_0/4 \qquad (3)$$

The electro-conductive layers 7 and 11, besides supplying the pumping electric signal to the device 100 and operatively providing the two plates between which the electric field required for the radiation generation is originated, can be considered to be included, in all respects, in the lower mirror DM and the upper mirror UM, respectively. Advantageously, in the proposed structure, the first multi-layer structure 16 has a sufficient width suitable to ensure that the main radiation area 30 is substantially or more preferably, entirely included between the upper mirror UM and the lower mirror DM.

With regard to the active means layer 10, the refraction index thereof ($n_{10}$) and the thickness thereof ($d_{10}$) substantially meet the relation:

$$n_{10} d_{10} = m \lambda_0/2 \qquad (4)$$

where m is an integral and positive numerical value. This relation being met, the active means layer 10, being in contact with the polysilicon layers 7 and 11 (which are, in turn, in contact with the mirrors DM and UM), changes the distribution of the energy bands of the layers included in the resonant cavity. The active means layer 10 causes a discontinuity, e.g., a fault in the resonant cavity energy band due to which a decrease in the reflectivity of the mirrors UM and DM estimated at the wavelength $\lambda_0$ occurs.

Some sizing examples of the thicknesses for the layers forming the resonant cavity device 100 are shown in the following Table 1. Particularly, these values have been indicated for two different emission wavelengths $\lambda_0$, in the case of m=1 in relation (4).

TABLE 1

| THICKNESS OF LAYERS (NM) AS A FUNCTION OF $\lambda_0$ (NM) | | |
|---|---|---|
| Layer | $\lambda_0 = 780$ | $\lambda_0 = 850$ |
| first dioxide layer 2; second dioxide layer 4; third dioxide layer 6; fourth dioxide layer 12; fifth dioxide layer 19 | 134 nm | 146 nm |
| first silicon layer 3; second silicon layer 5; third silicon layer 13; first doped polysilicon layer 7; second doped polysilicon layer 11 | 53 nm | 57 nm |
| active means layer 10 in SRO | 205 nm | 224 nm |

The first 20' and second 20" metallic regions defined during the metallization process 20 have the function of electric contacts allowing the active means layer 10 to be supplied with the pumping electric signal being suitably generated. Particularly, the first metallic region 20' is in contact with the first electro-conductive layer 7 whereas the second metallic region 20" is in contact with the second electro-conductive layer 11. Both the first 20' and second 20" have, for example, an annular base, and more precisely, the ring of the first metallic region 20' is outside or outer relative to the one of the second metallic region 20".

The pumping electric signal is, preferably, either a continuous or alternating potential difference (PD) applied to the first 7 and second 11 electro-conductive layers which entails a passage of the electric current and a generation of a corresponding substantially uniform electric field in the active means layer 10, e.g., with field lines being substantially transversal to the plane defined by the two layers 7 and 11. Typical values of this potential difference are 25-30 V or 50-60 V, as a result of the type of application and the type of device used and the type of active means.

The operation mode of the RCLED device 100 is now described. After a potential difference has been applied to the first 20' and second 20" metallic regions, and hence to the first 7 and second electro-conductive layers, respectively, a pumping current within the active means layer 10 of the SRO type and a corresponding electric field, the field lines of which are substantially confined between the two plates at the first region 9, are generated.

The pumping current electrons collide with the nanocrystals provided in the active means 10 thus generating electron-hole pairs which emit photons by recombining with one another in the nanocrystal, i.e., optical radiation. The generated optical radiation is spread within the cavity defined by the upper mirror UM and the lower mirror DM substantially at the main radiation area 30. Following these reflections within the cavity, destructive interferences and constructive interferences bringing to the selection of the radiation with the wavelength $\lambda_0$ occur.

A part of this radiation leaks from the upper mirror UM in the form of a beam passing through the portion of the passivation oxide layer 19 facing the radiation area 30 being substantially orthogonal to the latter. The presence of the resonant cavity allows a selected wavelength $\lambda_0$ and high-directivity optical radiation to be obtained. Furthermore, the RCLED device 100 has a high-efficiency emission, due to the electric pumping directly on the active means layer 10.

The invention described above can be also implemented for manufacturing a device of the VCSEL type which, as already said above, is a laser source. This VCSEL device can be structurally similar to the one described above and shown in FIG. 10, unless the active means layer 10 is such as to provide an optical population inversion subsequent to an electric pumping. In this case, the number of the pairs providing the dielectric mirrors requires to be suitably examined such as to obtain a suitable Q-factor.

At the current research state, some examples of active means which are assumed to be suitable to give rise to a population inversion are SRO doped with Erbium and a MQW comprising nanometric Si—SiO$_2$ layers. An active means including SRO doped with erbium is described in the article by M. E. Castagna et al. mentioned above. With regard to the SRO active means layer doped with Erbium, in this article it is proved that the electric pumping of the erbium ions being found in the SRO material, using this means as a dielectric in a MOS structure (Metal Oxide Semiconductor) can be carried out. However, the possibility of obtaining a population inversion has not been proved yet.

In the case where SRO is doped with Erbium there is provided a four-energy level system. The presence of the four energy levels aids in the population inversion. The SRO nanocrystals are excited by the collision of hot electrons. The nanostructure exciting time is of some μs. The excitation is thus transferred to the level $I_{11/2}$ of the Erbium ion near the nanostructure, and hence the $I_{13/2}$ level forming the metastable level with a decay time in the order of the ms, is excited by means of a rapid decay. Therefore, a population inversion occurs between the $I_{13/2}$ level and the $I_{15/2}$ level, which is the basic level for the Er ion.

With regard to the multi quantum well MQW, the VCSEL of the known type using layers of materials of the III-V group as an active means are also called quantum cascade lasers. In the case of a Si-based technology MQW, the MQW is included with nanometric layers of $SiO_2$ and Si being doped degenerate N+ (conduction band Fermi level). For a VCSEL, following the electric pumping of the active means by the two polysilicon layers 7 and 11, there is an electronic population inversion with a subsequent optical radiation stimulated emission.

The device 100 in accordance with the invention (both of the RCLED type, and the VCSEL type) is particularly suitable for applications in the optical interconnections as an optical radiation source to be launched, for example, in optical waveguides either of the integrated or fiber technology type. For example, the device of the invention can be employed for generating electromagnetic radiations with wavelengths ranging between 540 nm and 980 nm or 1540 nm.

The RCLED device can be employed, for example, in applications of the IrDA type (Infrared Data Association), e.g., in the infrared communications in which, for example, an emission wavelength may be 850 nm. Important characteristics are the absolute power, the total efficiency, and the low costs. On the contrary, the width of the emission spectrum and the luminosity are less important characteristics. For this reason, a resonant cavity is useful to be preferably provided with so-called low-reflectivity upper mirrors. In order to obtain this decrease in the reflectivity, the number of layers included in the upper mirror is reduced in some embodiments of the invention. For example, the upper mirror UM, instead of consisting of such pairs of silicon-silicon dioxide as to ensure even a reflectivity of 98%, includes a single polysilicon layer, for example the first doped polysilicon layer N+ 7, for pumping the active means, whereas the silicon dioxide layer may be the coating oxide layer, for example the passivation layer 19.

Figure 11:
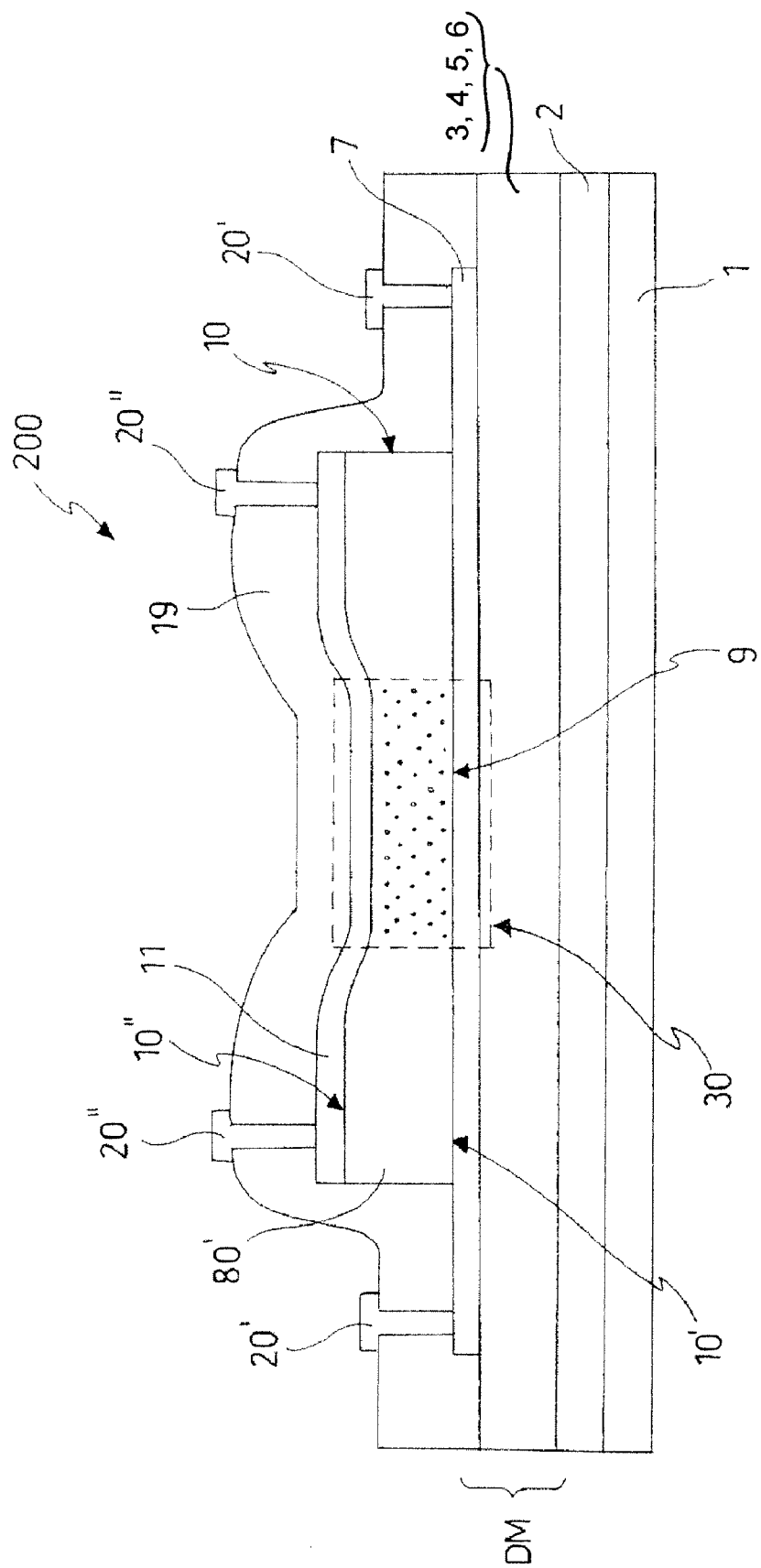
FIG. 11 is a longitudinal sectional view of a device being manufactured according to a variant of the invention.

In FIG. 11, a device 200 similar to the one 100 described above but obtained by a different method is shown. Moreover, it shall be noted that the embodiment from FIG. 11 shows by way of example the case where the upper mirror UM includes a single pair of layers such as the second polysilicon layer 11 and the passivation oxide layer 19. The device 200 from FIG. 11 is provided with a region 80' for insulating and defining the active area (i.e., the flat region taken up by the active means 10) obtained in a manner which is different from the one 8' from FIG. 10, instead of the oxide region 8' of the device 100.

According to this further method, the active means layer 10 is provided by being arranged above the first layer 7, after the first polysilicon layer 7 has been formed. The active means used is, preferably, SRO, i.e., silicon oxide having an excess of silicon. Afterwards, a silicon nitride protective layer (not shown in the figure) is formed above a part of the free surface of the active means 10. Particularly, this silicon nitride layer is arranged above a central area of the active means 10 so as to protect the part of the active means which will be involved in the generation of the optical radiation. An oxidation process (basically known to those skilled in the art) for the silicon located at the region of the active means 10 in SRO not protected by the silicon nitride layer is then carried out.

The dielectric defining the active area is obtained by subjecting the active means layer 10 to an oxidation process being carried out at such a temperature and period as to allow the substantially total oxidation of the exceeding silicon but without oxidizing the first doped polysilicon layer 7 situated on the lower mirror DM. Following this treatment, a stoichiometric oxide region (without exceeding silicon) 80' is increased in the nitride non-protected areas to the detriment of the exceeding silicon being found in the SRO layer, which is typically nearly around 40%. This oxidation technique is commonly employed for forming the so-called isolating LOCOS (LOCal Oxidation of Silicon) within the scope of the Si-based technology.

Thereby, the SRO active means 10 (shown in FIG. 11 with black dots) only takes up the central region and is defined by the stoichiometric oxide 80'. It shall be noted that due to the oxidation process the stoichiometric oxide 80' increases in thickness relative to the SRO active means 10, thus being connected to the latter by slight sloping walls. The stoichiometric oxide 80' is a dielectric region having a function which is similar to the one of the dielectric region 8' described with reference to the device 100.

This method is particularly advantageous because it allows a structure (being formed by the active means 10 and the insulating region 80') having an only slightly corrugated shape to be obtained. This allows the subsequent layers of the device 200 to be deposited on this structure so that they have substantially uniform thicknesses. Moreover, the use of the oxidation process reduces the number of the processing steps of the photolithographic type.

It shall be noted that the SRO active means 10 (thus having an excess of silicon) is more conductive than the stoichiometric oxide 80' and moreover, that the breakdown electric field of the SRO active means 10 ($E_{BD-SRO}$=2 MV/cm) is much lower than the one of the stoichiometric oxide ($E_{BD-SiO2}$=10 MV/cm). Since the thickness and the breakdown electric field of the insulating region 80' are higher than the thickness and the breakdown electric field of the active means 10, the electric field lines are much thicker at the active means 10, because the latter, on the other hand, has a lower thickness and breakdown.

Advantageously, the conveying of the electric field to the main radiation area 30, which can be carried out due to the presence of the dielectric region 8', allows reduction of the passage of the electric current 8 associated to the electric field and hence reduction of the generation of optical radiation between portions of the plates not facing the upper mirror UM. The optical radiation generated in portions of the active means layer 10 not facing the upper mirror UM (such as the peripheral regions of the active means 10) is often disadvantageous. In fact, this radiation does not suffer from the suitable reflections within the resonant cavity, thus causing an emission of optical radiation to the outside, having characteristics which are different from the one emitted at the main area 30. The use of the dielectric region 8' (similarly to the one 80') allows a particularly uniform optical radiation generation and emission in terms of power, wavelength and spectrum width to be obtained in the main area 30.

Moreover, the shape of the first rib 16 and the shape of the second electro-conductive layer 7 cause the interaction between the two plates to be reduced to a minimum outside the dielectric region 8' so as to have electric field lines which are insignificant relative to the main radiation area 30. This allows reduction of the possible occurrence of the resonance of the device due to the interaction between the first and second metallic regions in the case where an electric field is present outside the dielectric region 8'. Similar remarks are also valid for the device 200 from FIG. 11.

While there have been described above the principles of the present invention in conjunction with specific memory architectures and methods of operation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

The invention claimed is:

1. A device for emitting optical radiation, comprising:
    a first dielectric-type mirror and a second dielectric-type mirror defining a resonant cavity;
    an active layer in the resonant cavity comprising a main area excitable to generate the optical radiation;
    first and second electro-conductive layers associated with said first and second mirrors, respectively, for generating an electric field to which an exciting current for the active layer is associated, wherein said main area faces said first and second layers;
    a dielectric region included between said first and second layers spacing corresponding peripheral portions of said first and second layers from each other such that the first and second electro-conductive layers are spaced further apart in the peripheral portions and closer together in the main area so that the electric field being present in the main area is higher than an electric field between said peripheral portions, whereby the exciting current is generated in the main area of the active layer.

2. The device of claim 1, wherein:
    the active layer has a first surface and a second surface opposite to the first surface; and
    the first and second electro-conductive layers are arranged in contact with a first region of said first surface and with the second surface, respectively, wherein a portion of the active layer corresponds to the first region defining the main area generating the radiation.

3. The device of claim 2, wherein the dielectric region is a layer interposed between said first electro-conductive layer and a second region of the first surface.

4. The device of claim 1, further comprising a metallization supplying said electric field to the main area.

5. The device of claim 4, wherein the metallization comprises a first metallic region in contact with the first electro-conductive layer to supply the electric field.

6. The device of claim 5, wherein the metallization further comprises a second metallic region in contact with the second electro-conductive layer to supply the electric field.

7. The device of claim 1, wherein the first mirror is provided on a substrate of semiconductor material and comprises:
    at least one electro-insulating material layer arranged to contact said substrate; and
    at least one semiconductor layer arranged to contact said at least one electro-insulating layer and said first electro-conductive layer.

8. The device of claim 7, wherein said second mirror is provided on said second electro-conductive layer and comprises:
    at least one further electro-insulating material layer arranged to contact said second electro-conductive layer; and
    at least one further semiconductor layer in contact with said at least one further electro-insulating material layer.

9. The device of claim 8, wherein said at least one electro-insulating layer and at least one semiconductor layer are included in the first mirror and the first electro-conductive layer has a respective thickness and a respective refraction index such that the first mirror together with the first electro-conductive layer causes constructive interferences for a device emission wavelength so as to reflect the optical radiation with said wavelength to the active layer.

10. The device of claim 9, wherein said at least one further semiconductor layer and at least one further electro-insulating layer are in the second mirror and the second electro-conductive layer has a respective thickness and a respective refraction index such that the second mirror together with the second electro-conductive layer cause constructive interferences for said device emission wavelength so as to reflect the optical radiation with said wavelength to the active layer.

11. The device of claim 9, wherein the active layer comprises a semiconductor layer having a corresponding thickness and refraction index such that the second mirror is such as to allow the electromagnetic radiation to be partially transmitted to the outside of the resonant cavity.

12. The device of claim 9, wherein said at least one electro-insulating material layer is in the first mirror and is arranged in contact with the substrate and wherein the at least one electro-insulating material layer defines an electric insulation between the resonant cavity and the substrate.

13. The device of claim 12, wherein a passivation layer is provided on the second mirror.

14. The device of claim 13, wherein first and second metallic regions of a metallization supplying the electric field to the main area are in contact with the first and second electro-conductive layers, respectively, by means of grooves defined in the passivation layer.

15. The device of claim 13, wherein the at least one electro-insulating material layer comprises silicon nitride.

16. The device of claim 15, wherein at least one of said first and second electro-conductive layers is doped polysilicon of the type N+.

17. The device of claim 16, wherein the material of the active layer is silicon dioxide enriched with silicon.

18. The device of claim 16, wherein the material of the active layer is Multi Quantum Well (MQW).

19. The device of claim 16, wherein the material of the active layer allows a laser population inversion.

20. The device of claim 19, wherein the active layer is silicon dioxide doped with at least one of the rare earth materials belonging to the group consisting of ytterbium, terbium, and erbium.

21. The device of claim 14, wherein the semiconductor material of said substrate is silicon.

22. The device of claim 21, wherein the at least one electro-insulating material layer comprises silicon dioxide.

23. The device of claim, 1 wherein an applied electric pumping signal is either a continuous or alternating potential difference.

24. The device according to claim 1, wherein said active layer is an optical radiation emission diode within said resonant cavity.

25. The device of claim 1, wherein the dielectric region is a portion of the active layer separate from the main area.

26. The device of claim 25, wherein the main area is formed of silicon dioxide enriched with silicon and the dielectric region is formed of stoichiometric oxide defining the main area.

27. The device of claim 1, wherein the dielectric region comprises a solid.

28. The device of claim 27, wherein the dielectric region comprises silicon dioxide.

29. The device of claim 27 wherein the dielectric region is a toroidal structure substantially trapezoidal in cross section.

30. The device of claim 1 wherein the dielectric region is a toroidal structure substantially trapezoidal in cross section.

* * * * *